United States Patent
Li et al.

(10) Patent No.: US 8,027,028 B2
(45) Date of Patent: Sep. 27, 2011

(54) PRECISE POSITIONING SYSTEM FOR DUAL STAGE SWITCHING EXPOSURE

(75) Inventors: Yingsheng Li, Shanghai (CN); Xiaoping Li, Shanghai (CN); Zhiyong Yang, Shanghai (CN); Jun Guan, Shanghai (CN); Shaowen Gao, Shanghai (CN); Wenfeng Sun, Shanghai (CN); Gang Li, Shanghai (CN); Yanmin Cai, Shanghai (CN)

(73) Assignee: Shanghai Micro Electronics Equipment Co., Ltd., Shanghai (CN)

( * ) Notice: Subject to any disclaimer, the term of this patent is extended or adjusted under 35 U.S.C. 154(b) by 258 days.

(21) Appl. No.: 12/299,077

(22) PCT Filed: Nov. 20, 2006

(86) PCT No.: PCT/CN2006/003126
§ 371 (c)(1),
(2), (4) Date: Oct. 30, 2008

(87) PCT Pub. No.: WO2008/011766
PCT Pub. Date: Jan. 31, 2008

(65) Prior Publication Data
US 2009/0219503 A1 Sep. 3, 2009

(30) Foreign Application Priority Data
Jul. 18, 2006 (CN) ...................... 2006 2 0044000 U

(51) Int. Cl.
G03B 27/58 (2006.01)
G03B 27/62 (2006.01)
(52) U.S. Cl. ............................................ 355/72; 355/75

(58) Field of Classification Search ............... 355/72–75, 355/10, 12, 53, 55, 77, 89, 52
See application file for complete search history.

(56) References Cited

U.S. PATENT DOCUMENTS

| | | | |
|---|---|---|---|
| 6,262,796 B1 * | 7/2001 | Loopstra et al. | 355/53 |
| 6,353,271 B1 * | 3/2002 | Williams | 310/12.06 |
| 6,628,406 B1 * | 9/2003 | Kreuzer | 356/508 |
| 6,635,887 B2 * | 10/2003 | Kwan et al. | 250/491.1 |
| 6,665,054 B2 * | 12/2003 | Inoue | 355/77 |
| 6,927,505 B2 * | 8/2005 | Binnard et al. | 310/12.01 |
| 2002/0196421 A1 * | 12/2002 | Tanaka et al. | 355/72 |
| 2010/0045961 A1 * | 2/2010 | Li et al. | 355/73 |

FOREIGN PATENT DOCUMENTS

| | | |
|---|---|---|
| CN | 1485694 | 3/2004 |
| JP | 2004-342638 | 12/2004 |
| JP | 2005-038874 | 2/2005 |
| WO | WO-98/40791 | 9/1998 |
| WO | WO-01/40875 | 6/2001 |

* cited by examiner

Primary Examiner — Hung Henry Nguyen
Assistant Examiner — Michelle Iacoletti
(74) Attorney, Agent, or Firm — Rabin & Berdo, PC

(57) ABSTRACT

A precise positioning system for dual stage switching exposure, which includes a base, a first wafer stage positioning unit disposed on the base for a pre-processing workstation, and a second wafer stage positioning unit for an exposure workstation. Each of the wafer stage positioning units includes a wafer stage, a motion positioning detector, an X-direction guide bar, and a Y-direction guide bar. The pre-processing workstation and the exposure workstation both have two X-direction guide bars positioned on and movable along the Y-direction guide bars. The X-direction guide bars of adjacent workstations can be connected to each other.

8 Claims, 4 Drawing Sheets

PRECISE POSITIONING SYSTEM FOR DUAL STAGE SWITCHING EXPOSURE

TECHNICAL FIELD

The present invention relates to the field of motion positioning techniques, particularly to a precise positioning system for dual stage switching exposure.

BACKGROUND ART

Exposure refers to a process of exposing and transferring the chip pattern on a mask onto a silicon wafer, which is one of the important processes during semiconductor manufacturing. An exposure process comprises several sub-processes, such as wafer loading/unloading, pre-alignment, alignment, level adjustment detection, exposure, etc. The apparatus for exposure process is called a lithography machine. A main part of a lithography machine is the wafer stage motion positioning system, whose operation efficiency greatly influences the throughput of the lithography machine.

Present high-resolution lithography machines are prone to adopt a dual wafer stage structure. As shown in FIG. 1, a lithography machine adopting dual stage structure comprises from the top down an illumination system 4, a reticle stage positioning system 3, a projection object lens system 2, a focus and level adjustment detecting system 5, an alignment system 6, two wafer stage positioning units 100a, 100b, a base 1, etc. Wafer loading/unloading, pre-alignment, alignment, level adjustment detection and other pre-processing steps are carried out on the wafer stage unit 100a, which can work simultaneously with the wafer stage unit 100b responsible for the exposure process.

A dual wafer stage structure is described in PCT patent application WO98/40791, in which, each wafer stage has two exchangeable displacement units and an object holder. The object holders are connected to the guide bars. During operation, several pre-processing steps before exposure process are carried out on a wafer at the pre-processing workstation, while the exposure process is carried out on another wafer at the exposure workstation. After finishing these two series of steps, the two wafer stages move to an intermediate position to exchange the two object holders, so that either object holder moves from its displacement unit to the other holder's displacement unit, thereby accomplishing the exchange of two wafer stages.

The above mentioned structure enables the simultaneous operation and the exchange of two wafer stages, however, it has the following disadvantages: when the two wafer stages are exchanging, during a short period of time, the wafer stages are under an unrestricted status, so that the positioning accuracy of the system is influenced; besides, there exists a risk of collision of the two wafer stages during the exchange process due to the overlapped moving area and the high running speed of the two stages. Any collision will lead to a serious result. Although software can be used to control and protect the wafer stages, collision will still be possible if the software goes wrong or the power is suddenly cut off.

SUMMARY OF INVENTION

It is an object of the present invention to provide a precise positioning system for dual stage switching exposure to improve the operation accuracy and the throughput of lithography machines.

In order to achieve the aforementioned object, the present invention is set forth as follows: the system comprises at least a base, a first wafer stage positioning unit disposed on the base for a pre-processing workstation, and a second wafer stage positioning unit for an exposure workstation, each of the wafer stage positioning units further comprising at least a wafer stage, a motion positioning detector, an X-direction guide bar, and a Y-direction guide bar, characterized in that each workstation has two X-direction guide bars positioned on and movable along the Y-direction guide bars, the X-direction guide bars of adjacent workstations can be connected to each other. The X-direction guide bars are used to support the wafer stages. The linear gratings positioned on the guide bars cooperate with the motion positioning detectors to measure and feedback the position data of the stages during the wafer alignment process at the pre-processing workstation and the wafer exposure process at the exposure workstation.

A cable stage is connected to each of the wafer stages. The cable stages move on opposite sides of the base via cable stage guide bars of the system.

The wafer stage is disposed in noncontact association with the X-direction guide bars. The X-direction guide bars are disposed in noncontact association with the Y-direction guide bars. The noncontact association can be achieved through gas levitation bearing or magnetic levitation bearing, for reducing the friction during stepping motions.

The wafer stage is positioned on either of the X-direction guide bars, and can step along the X-direction guide bar. Each of the workstations has two Y-direction guide bars, the Y-direction guide bars and either of the X-direction guide bars of the corresponding workstation forming an "H" shaped structure. Linear motors are installed into the X-direction guide bars for driving the X-direction guide bars to step along the Y-direction guide bars.

The motion positioning detectors are laser interferometers and linear gratings. Laser interferometers are used for level adjustment detection and alignment at the pre-processing workstation and for exposure position measurement at the exposure workstation. The linear gratings are positioned on both of the X-direction guide bars and at least one of the Y-direction guide bars of each workstation to cooperate with the laser interferometers in measuring and feeding back the positions of the wafers.

Compared with the known art, the present invention has the following advantages: since each of the workstations has two X-direction guide bars, when switching wafer stages, the switching paths are short, greatly raising the speed of wafer stage exchange, therefore, improving the throughput of the lithography machine. In addition, the wafer stages are symmetrically positioned according to the central axis of the guide bars, and are connected to the guide bars both during the processes at the two workstations and during the switching process, thereby assuring the operation accuracy of the system. Moreover, the dual stage structure eliminates the overlapped moving area of the two stages, preventing the collision between the stages, so that no extra protection devices are needed, and the structure of the system can be simplified. Furthermore, there is no specific limitation on the size of the wafer stages, and therefore, the system can be used in exposure processes involving wafers of different sizes. Due to the similarity of the wafer stage positioning units of the two workstations, the system can be easily extended into a multiple stage positioning system.

DETAILED DESCRIPTION OF PREFERRED EMBODIMENTS

The present invention will be described in detail by reference to the drawings and the preferred embodiments.

Figure 1:
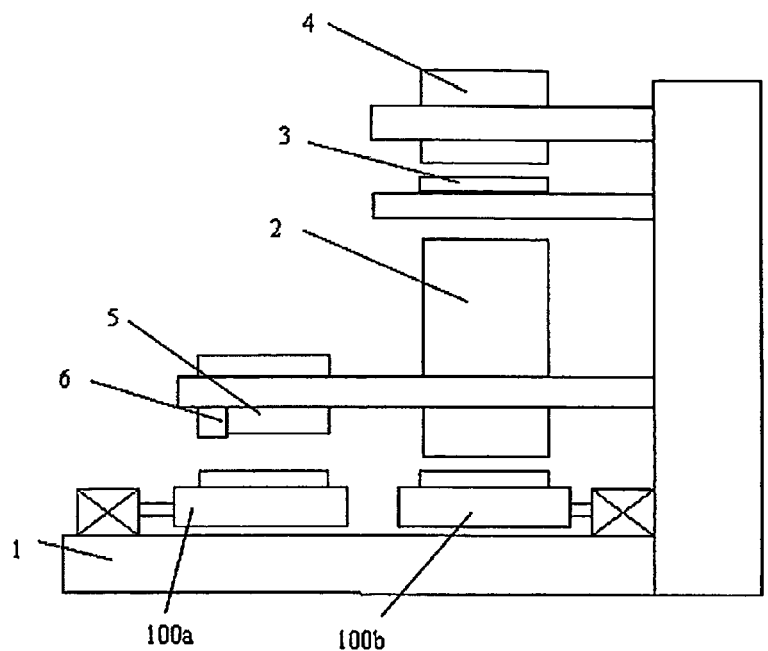
FIG. 1 is a schematic view of the structure of a dual wafer stage switching step-and-scan projection lithography machine.
Figure 2:
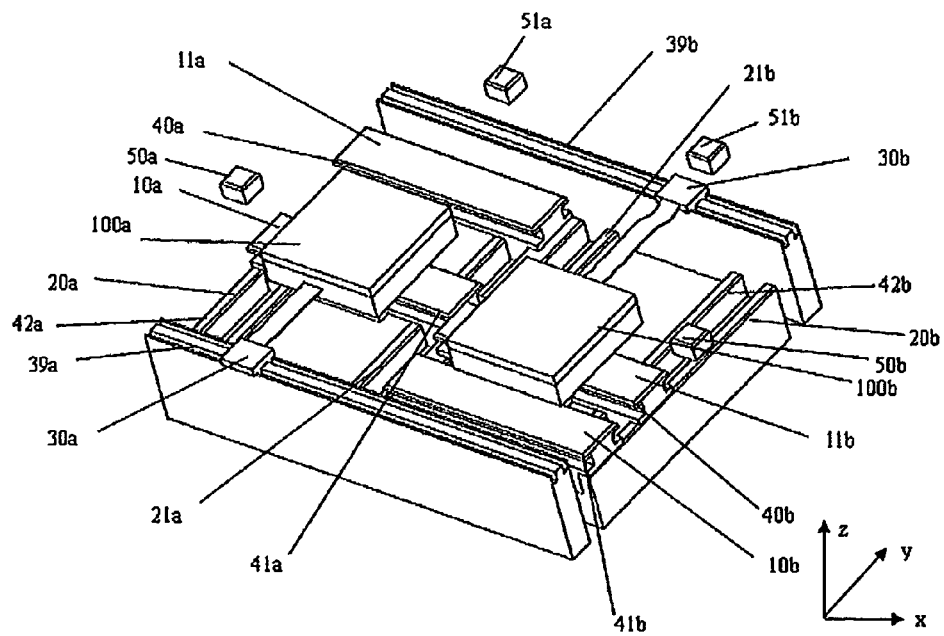
FIG. 2 is a layout of the structure of the dual stage positioning system of the present invention.

FIG. 2 shows the operation status of the dual wafer stage positioning system of the present invention, which comprises a base 1, a first wafer stage positioning unit disposed on the base 1 for a pre-processing workstation, and a second wafer stage positioning unit disposed on the base 1 for an exposure workstation. Each of the wafer stage positioning units comprises a wafer stage 100a (for pre-processing workstation) or 100b (for exposure workstation); motion positioning detectors (laser interferometers) 50a, 51a, 50b, 51b; two X-direction guide bars 10a, 11a or 10b, 11b, wherein, X-direction guide bars 10a, ha belong to the wafer stage positioning unit of the pre-processing workstation, while X-direction guide bars 10b, 11b belong to the wafer stage positioning unit of the exposure workstation; two Y-direction guide bars 20a, 21a or 20b, 21b, wherein, Y-direction guide bars 20a, 21a belong to the wafer stage positioning unit of the pre-processing workstation, while Y-direction guide bars 20b, 21b belong to the wafer stage positioning unit of the exposure workstation.

The wafer stages are positioned on and movable along the X-direction guide bars. The X-direction guide bars are positioned on the Y-direction guide bars and move along the Y-direction guide bars driven by linear motors. The X-direction guide bars of adjacent workstations can be connected to each other. The guide bars have linear gratings 40a, 41a, 42a, 40b, 41b, 42b disposed thereon, wherein, 40a is disposed on X-direction guide bar 11a; 41a is disposed on X-direction guide bar 10a; 42a is disposed on Y-direction guide bar 20a; 40b is disposed on X-direction guide bar 11b; 41b is disposed on X-direction guide bar 10b; 42b is disposed on Y-direction guide bar 20b. Wafer stage 100a is connected to a cable stage 30a moving along cable stage guide bar 39a. Wafer stage 100b is connected to a cable stage 30b moving along cable stage guide bar 39b.

Referring to FIG. 2, wafer stage 100a is supported by X-direction guide bar 10a. A series of pre-processing steps before exposure are carried out on wafer stage 100a at the pre-processing workstation. Wafer stage 100b is supported by X-direction guide bar 11b. The exposure process is carried out on wafer stage 100b at the exposure workstation. X-direction guide bars 11a, 10b are temporarily under an idle status, respectively positioned at the edge of their own workstations without interfering with the wafer stages under operation. Cable stages 30a, 30b are driven by the motors set inside to keep the cables moving synchronously with wafer stages 100a, 100b.

The present invention has adopted non-friction vacuum preload hydrostatic gas bearings between: wafer stage 100a and X-direction guide bars 10a, 11a; wafer stage 100b and X-direction guide bars 10b, 11b; X-direction guide bars 10a, 11a and Y-direction guide bars 20a, 21a; X-direction guide bars 10b, 11b and Y-direction guide bars 20b, 21b. If necessary, permanent magnetic hydrostatic gas bearings can be used instead.

Each guide bar of the present invention has a linear grating disposed thereon. Gratings 40a, 41a are used as position feedback devices when wafer stage 100a is moving in the X-direction. Gratings 40b, 41b are used as position feedback devices when wafer stage 100b is moving in the X-direction. Grating 42a is used as position feedback device when X-direction guide bars 10a, 11a are moving in the Y-direction. Grating 42b is used as position feedback device when X-direction guide bars 10b, 11b are moving in the Y-direction. Motion positioning detectors 50a, 51a are used for real-time detection and control in alignment, level adjustment detection at the pre-processing workstation. Motion positioning detectors 50b, 51b are used for real-time detection and control in exposure position determination at the exposure workstation.

FIGS. 3 to 6 are schematic views of the dual stage switching process.

Figure 3:
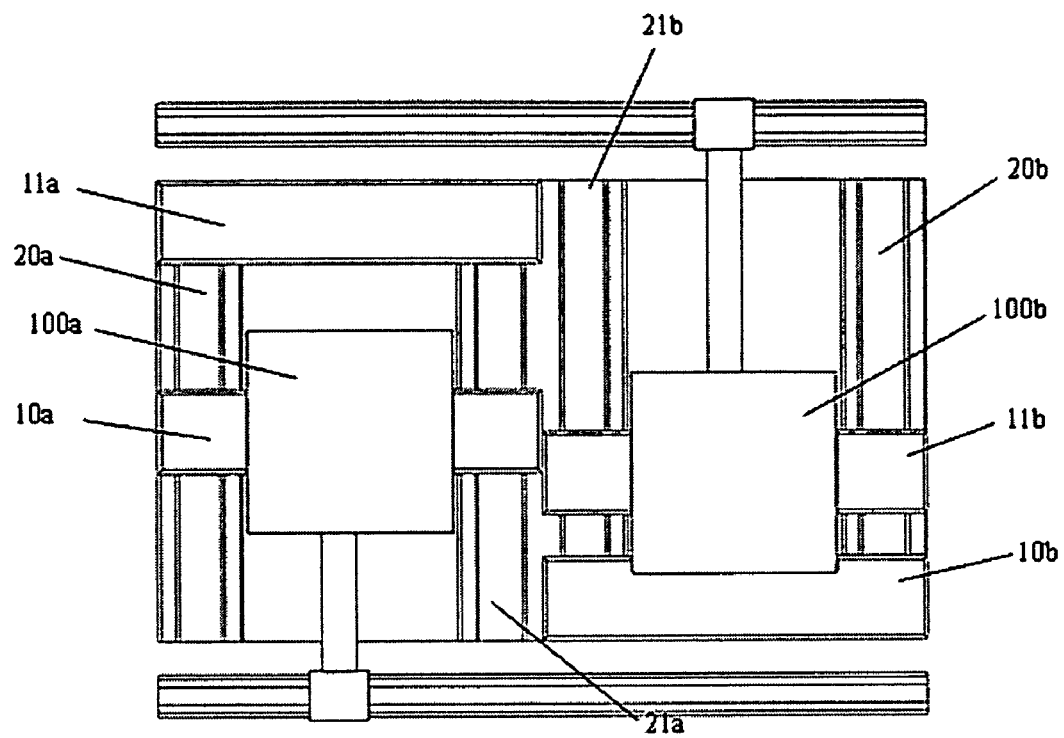
FIG. 3 is a top plan view of the two wafer stages under the operation status.

FIG. 3 is a top plan view of the two wafer stages under the operation status. X-direction guide bars 11a, 10b under idle status are respectively positioned at the edge of their own workstations to make sure that the movements of wafer stages 100a, 100b are not interfered.

Figure 4:
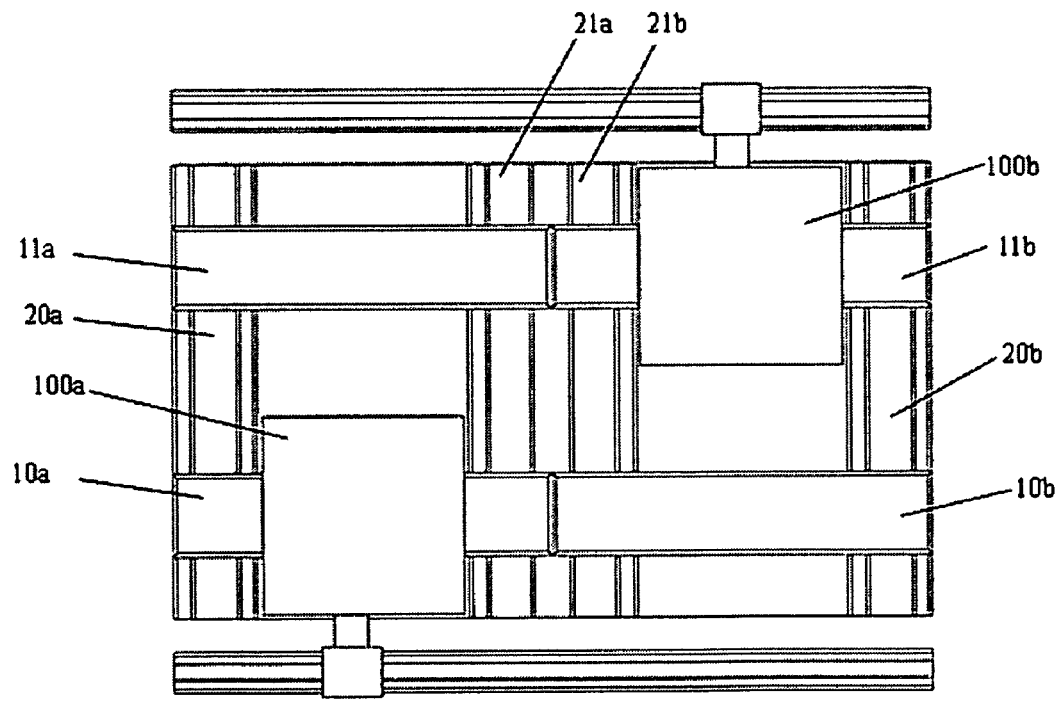
FIG. 4 is a top plan view of the two wafer stages at the switching position.

FIG. 4 is a top plan view of the two wafer stages 100a, 100b under the switching position. When wafer stages 100a, 100b finish the work at their respective workstation, the original idle X-direction guide bars 11a; 10b are driven by linear motors to move along Y-direction guide bars 20a, 21a; 20b, 21b from the edges to the switching position. X-direction guide bars 10a, 11b also move to the switching position, so that X-direction guide bars 11a and 11b; 10a and 10b can be accurately connected to each other. Then, wafer stage 100a is driven by the linear motor to move from the pre-processing workstation to the exposure workstation along the X-direction. Wafer stage 100b is driven by the linear motor to move from the exposure workstation to the pre-processing workstation.

Figure 5:
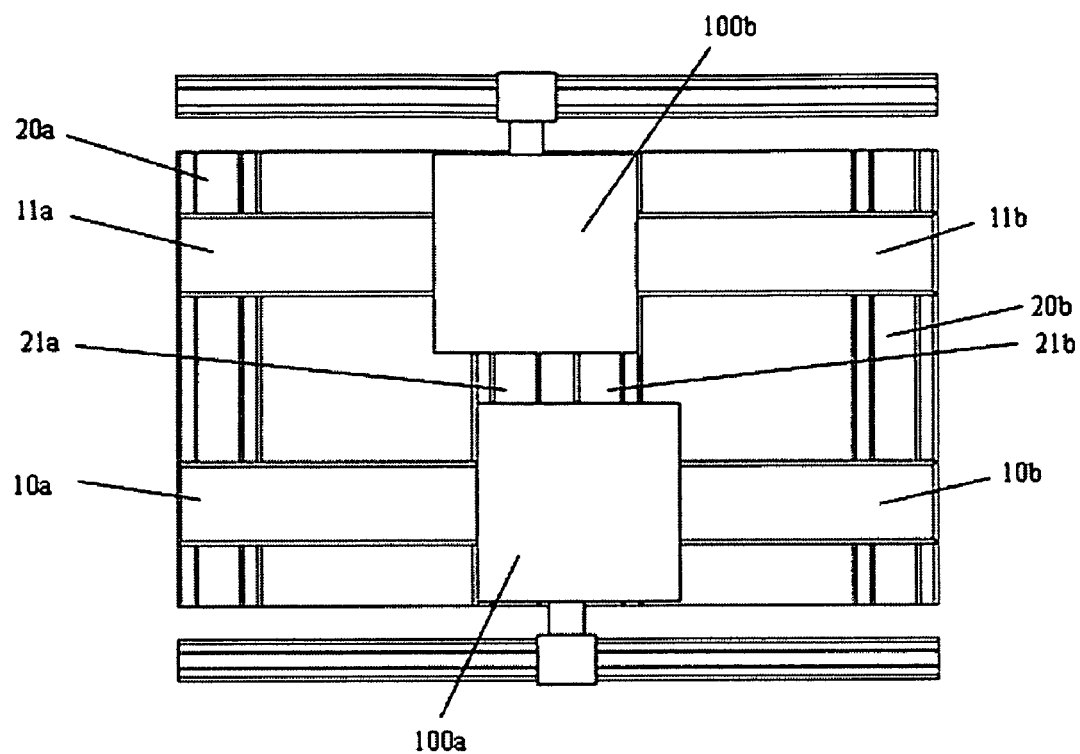
FIG. 5 is a top plan view of the two wafer stages during the switching process.

FIG. 5 is a top plan view of the two wafer stages during the switching process.

Figure 6:
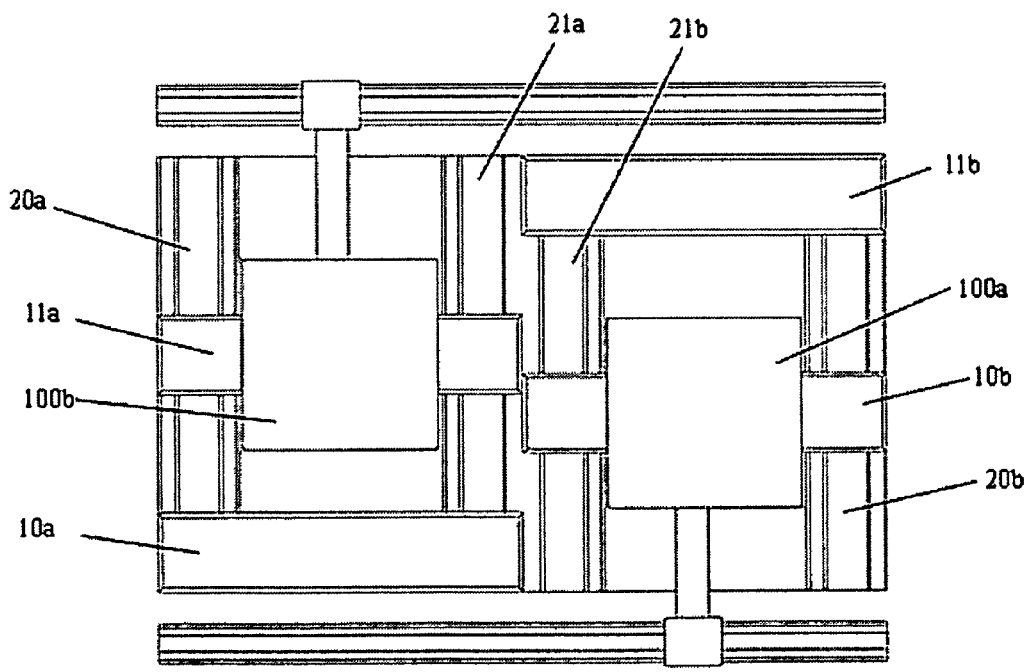
FIG. 6 is a top plan view of the two wafer stages after the switching process.

When the two stages are switched and arrive at the corresponding workstation, the pre-processing steps and the exposure process are carried out at the corresponding workstation. FIG. 6 is a top plan view of the two wafer stages after the switching process. X-direction guide bars 10a, 11b move to the edge of their own workstations, staying under an idle status. Wafer stages 100a, 100b are respectively supported by X-direction guide bars 10b, 11a. The exposure process is carried out on stage 100a at the exposure workstation. Pre-processing steps before exposure are carried out on stage 100b at the pre-processing workstation. When the exposure process and the pre-processing steps of the two stages are finished, the four X-direction guide bars move to the switching position again in the same way as described above to repeat the switching process as shown in FIGS. 4 to 6, thereby finishing the continuous and complete process of wafer exposure.

Figure 7:
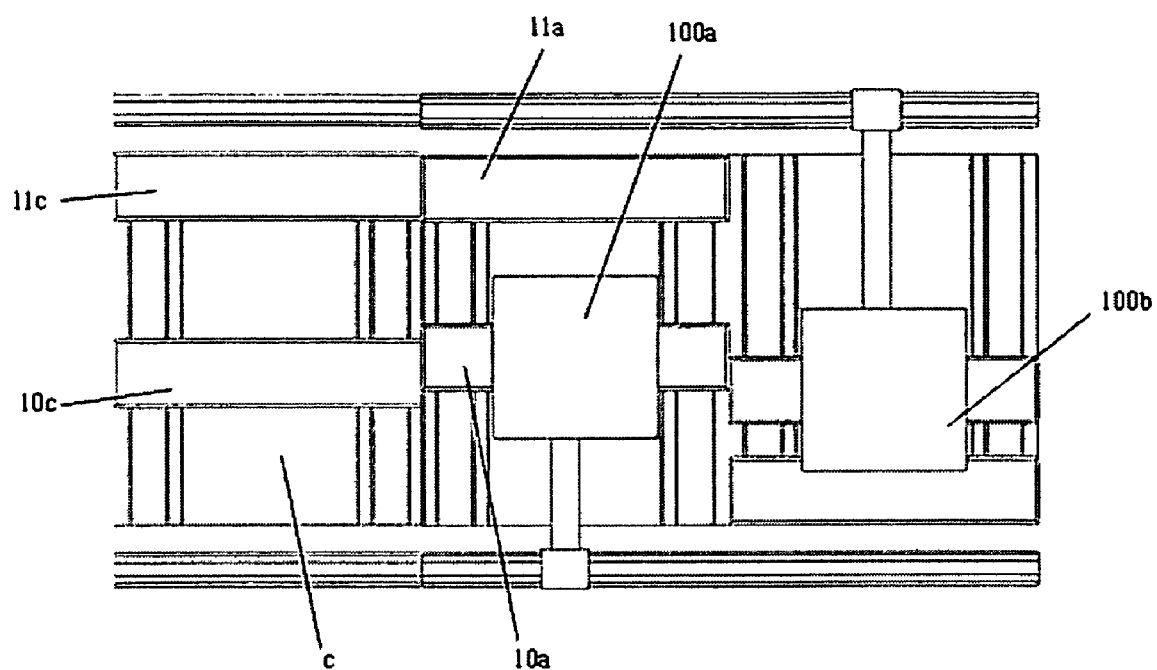
FIG. 7 is a schematic view of a multiple stage system.

FIG. 7 is a top plan view of a three stage system derived from the system described above to explain the flexibility of the present invention. Since the structures of the two workstations of the system are quite similar, when more workstations are needed under other technical requirements, the system can be easily extended to a multiple stage structure. Referring to FIG. 7, a wafer stage positioning unit c having two X-direction guide bars 10c, 11c is added to the original system. The operation and detection methods are the same as the two positioning units mentioned above. When wafer stage 100a or 100b needs to move to workstation c, just connect the X-direction guide bars 10c, 11c to 10a, ha and drive the wafer stages to move in the X-direction, so that the three wafer stages can be switched. Similarly, the present system can be further extended into a multiple stage system having more than three workstations.

The foregoing description has disclosed some embodiments of the present invention. But the present invention should not be restricted to the field of motion positioning of the semiconductor lithography process. The present invention can be used in any apparatus or system involving precise positioning techniques and requiring the exchange and simultaneous operation of two stages. Although the preferred embodiments of the present invention are disclosed as above, technicians of this field should aware that any modification, interpolation or variation within the principle of the present invention falls in the scope of the present invention.

What is claimed is:

1. A precise positioning system for dual stage switching exposure, comprising:
    a base;
    two wafer stage positioning units disposed on the base, and each including a first X-direction guide bar and a second X-direction guide bar that are individually movable along a Y direction perpendicular to the X direction, the first and second X-direction guide bars of one wafer stage positioning unit being respectively alignable with the first and second X-direction guide bars of the other wafer stage positioning unit;
    a first wafer stage placed on the first X-direction guide bar of one wafer stage positioning unit, and, when the first X-direction guide bars of the two wafer stage positioning units are aligned, being movable to the other wafer stage positioning unit along the aligned first X-direction guide bars; and
    a second wafer stage placed on the second X-direction guide bar of the other wafer stage positioning unit, and, when the second X-direction guide bars of the two wafer stage positioning units are aligned, being movable to the one wafer stage positioning unit along the aligned second X-direction guide bars.

2. A precise positioning system as claimed in claim 1, characterized in that a cable stage is connected to each of said wafer stages, said cable stages moving on opposite sides of said base via cable stage guide bars of said system.

3. A precise positioning system as claimed in claim 1, characterized in that
    said first and second wafer stages are respectively disposed in noncontact association with said first and second X-direction guide bars, thereby enabling frictionless relative motion therebetween; and
    said first and second X-direction guide bars are frictionlessly movable along the Y direction.

4. A precise positioning system as claimed in claim 3, characterized in that said noncontact association can be achieved through gas levitation bearing or magnetic levitation bearing.

5. A precise positioning system as claimed in claim 1, characterized in that each of said wafer stage positioning units has two Y-direction guide bars, said Y-direction guide bars and either of said X-direction guide bars of the corresponding workstation forming an "H" shaped structure.

6. A precise positioning system as claimed in claim 1, characterized in that said wafer stage positioning units each include a motion positioning detector, the motion positioning detectors being laser interferometers and linear gratings.

7. A precise positioning system as claimed in claim 6, characterized in that said laser interferometers are respectively positioned on adjacent sides of each wafer stage positioning unit.

8. A precise positioning system as claimed in claim 6, characterized in that
    each of said wafer stage positioning units has a Y-direction guide bar; and
    said linear gratings are positioned on both of the X-direction guide bars and the Y-direction guide bar.

* * * * *